(12) United States Patent
Keil

(10) Patent No.: US 8,970,030 B2
(45) Date of Patent: Mar. 3, 2015

(54) ELECTRONIC ASSEMBLY AND METHOD FOR PRODUCING SAME

(75) Inventor: Matthias Keil, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/878,369

(22) PCT Filed: Sep. 23, 2011

(86) PCT No.: PCT/EP2011/066608
§ 371 (c)(1),
(2), (4) Date: Apr. 8, 2013

(87) PCT Pub. No.: WO2012/045600
PCT Pub. Date: Apr. 12, 2012

(65) Prior Publication Data
US 2013/0201614 A1 Aug. 8, 2013

(30) Foreign Application Priority Data
Oct. 7, 2010 (DE) .......................... 10 2010 042 168

(51) Int. Cl.
*H01L 23/34* (2006.01)
*H05K 7/20* (2006.01)
*H01L 21/56* (2006.01)
*H01L 23/495* (2006.01)
(Continued)

(52) U.S. Cl.
CPC .......... *H05K 7/20409* (2013.01); *H01L 21/565* (2013.01); *H01L 23/49537* (2013.01);
(Continued)

(58) Field of Classification Search
CPC ....... H01L 23/40; H01L 23/42; H01L 23/433; H01L 23/4338; H01L 35/06; H01L 41/0536

USPC ......................................... 257/718, 726, 727
See application file for complete search history.

(56) References Cited

U.S. PATENT DOCUMENTS 5,332,291 A * 7/1994 Fujimura et al. .............. 297/480
5,332,921 A 7/1994 Dousen et al.
(Continued)

FOREIGN PATENT DOCUMENTS

DE 102007032142 1/2009
DE 102008040488 * 1/2010
JP H06151703 5/1994

OTHER PUBLICATIONS

International Search Report for Application No. PCT/EP2011/066608 dated Jan. 13, 2012 (2 pages).

*Primary Examiner* — Matthew W Such
*Assistant Examiner* — Samuel Lair
(74) *Attorney, Agent, or Firm* — Michael Best & Friedrich LLP

(57) ABSTRACT

The invention relates to an electronic module and to a method for producing same, comprising a mold body (2), a first circuit carrier (3; 13) having a first inner face (3*a;* 13*a*), on which electronic components (5) are arranged, and a first outer face (3*b;* 13*b*), a second circuit carrier (4; 14) having a second inner face (4*a;* 14*a*), on which electronic components (5) are arranged, and a second outer face (4*b;* 14*b*), and at least one spring device (6, 7; 16) which connects the inner faces (3*a*, 14*a;* 13*a*, 14*a*), or surfaces of electronic components (5) arranged thereon, of the first and second circuit carriers (3, 4; 13, 14), wherein the first and second outer faces (3*a*, 4*a;* 13*a*, 14*a*) are exposed towards the outside of the electronic module in order to emit heat directly to the outside, and wherein the first and second outer faces (3*a*, 4*a;* 13*a*, 14*a*) are parallel to each other.

5 Claims, 2 Drawing Sheets

(51) Int. Cl.
*H05K 13/04* (2006.01)
*H01L 23/00* (2006.01)

(52) U.S. Cl.
CPC .... *H01L23/49551* (2013.01); *H01L 23/49575* (2013.01); *H05K 13/04* (2013.01); *H01L 2224/48247* (2013.01); *H01L 24/48* (2013.01); *H01L 2224/48472* (2013.01); *H01L 2924/19107* (2013.01)
USPC .... 257/727; 257/718; 257/726; 257/E23.051; 257/E23.08; 257/E23.083; 257/E23.087; 257/E23.101

(56) References Cited

U.S. PATENT DOCUMENTS

| | | | |
|---|---|---|---|
| 2004/0057214 | A1* | 3/2004 | Alcoe et al. .................... 361/719 |
| 2004/0156173 | A1* | 8/2004 | Jeong ............................. 361/704 |
| 2005/0040515 | A1* | 2/2005 | Inoue et al. .................... 257/706 |
| 2007/0029648 | A1 | 2/2007 | Gerber et al. |
| 2008/0246130 | A1 | 10/2008 | Carney et al. |
| 2010/0170706 | A1* | 7/2010 | Kimmich et al. ............. 174/256 |
| 2011/0182048 | A1* | 7/2011 | Roethlingshoefer et al. . 361/820 |

* cited by examiner

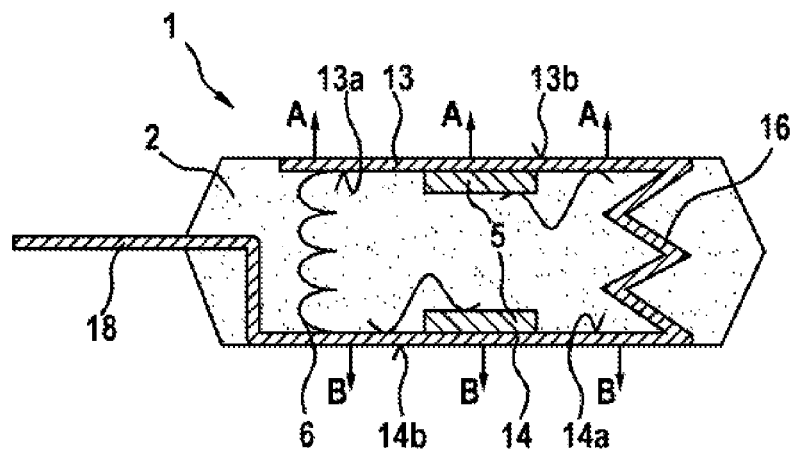
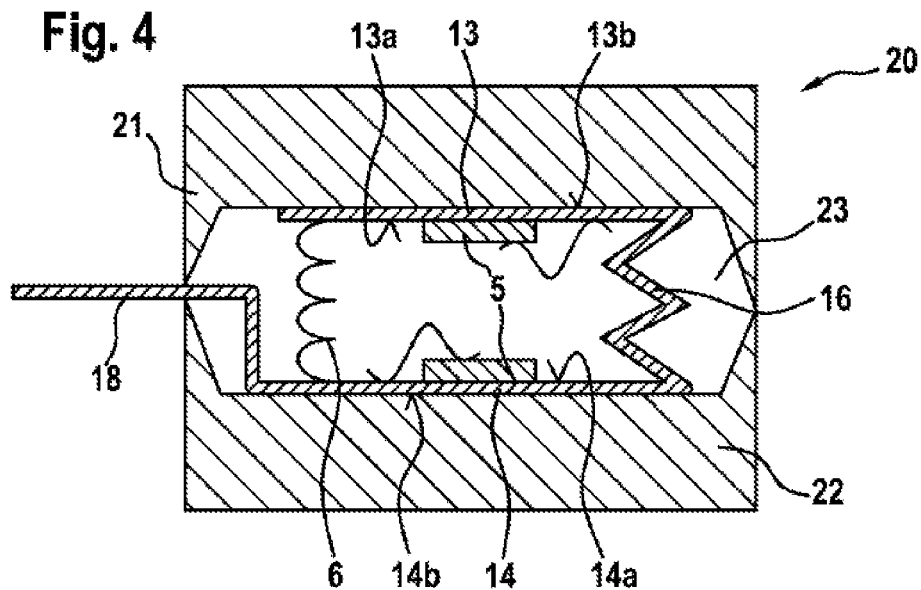

ELECTRONIC ASSEMBLY AND METHOD FOR PRODUCING SAME

BACKGROUND OF THE INVENTION

The present invention relates to an electronic assembly, particularly a power electronics unit, and to a method for manufacturing the electronic assembly.

Electronic assemblies are used in diverse applications in the prior art. In this case, the electronic assemblies are provided as molded modules. These molded modules may have a face which is exposed on one side and which is not surrounded by the molding compound, known as exposed pads, which can be used to dissipate heat. Usually, these heat-dissipating, outwardly directed faces are produced by milling off or grinding off the surfaces of the molded modules. This is relatively complex and time-consuming, however. In addition, such machining processes can result in the electronic assembly being damaged.

SUMMARY OF THE INVENTION

By contrast, the inventive electronic assembly has the advantage that the electronic assembly has two parallel outside faces of circuit carriers for dissipating heat. In this case, the electronic assembly according to the invention can be provided very easily and inexpensively. In particular, on the basis of the invention, no further remachining of the assembly is necessary after a molding process, which means that there is no risk of undesirable damage to the assembly occurring during subsequent machining. Furthermore, the invention allows the provision of defined faces which dissipate the heat very well and which are exposed toward the outside of the assembly. The invention achieves this by virtue of the electronic assembly comprising a molded body and also a first and a second circuit carrier, wherein the circuit carriers each have an inside face and an outside face. In this case, the assembly can dissipate heat directly to the outside via the outside faces which are exposed toward the outside. The outside faces of the circuit carriers in this case are arranged on opposite sides of the electronic assembly, which means that the heat from the electronic assembly can be dissipated in directions that are 180° opposite one another. In addition, a spring apparatus which connects the two circuit carriers is provided between the inside faces. In this case, the spring apparatus may be in direct contact with the inside faces or is arranged on the inside faces of the electronic components or the like. The spring apparatus in this case has the particular task of keeping the two circuit carriers in a defined position parallel to one another during the molding process. Alternatively, the spring apparatus can also engage with surfaces of components which are arranged on the inside faces.

Preferably, the two circuit carriers and the spring apparatus are provided as an integral component. This allows the number of individual parts to be reduced, and manufacture is possible particularly inexpensively. With particular preference, the two circuit carriers and the spring apparatus are provided as a leadframe, the leadframe being bent such that the two circuit carriers and the spring apparatus are formed. By way of example, the spring apparatus can be obtained by bending the leadframe a plurality of times, with the result that a resilient region is obtained.

With further preference, a second, separate spring apparatus is also provided in addition to the integrated spring apparatus. This allows the circuit carriers to be supported resiliently at two different positions, particularly at opposite end regions.

According to a further preferred refinement of the invention, the two circuit carriers have a common electrical connection.

According to an alternative refinement of the present invention, the electronic assembly comprises a first and a second circuit carrier and also a spring apparatus, each of which are provided as separate components. Although this requires an increased number of components, the manufacture of the components can be simplified, since the spring apparatus does not need to be manufactured as an integral part of the circuit carriers. Preferably, the spring apparatus in this case comprises at least one separate spring element which determines the positions of the two separate circuit carriers during the molding process. With further preference, the two separate circuit carriers each have separate electrical connections. Preferably, two or four separate swing elements are provided.

According to a preferred refinement of the present invention, the spring apparatus additionally comprises an electrically conductive function. Hence, the spring apparatus has not only the spring property but also a further property, with the result that it is possible to produce electrical connections from the first to the second circuit carrier by means of the spring apparatus, for example.

The inventive method for manufacturing the electronic assembly having two circuit carriers and a molded body comprises the steps of arranging the two circuit carriers in a molding tool, wherein a spring apparatus is arranged between the first and second circuit carriers. In this case, the spring apparatus is arranged such that the outside faces of the two circuit carriers are pushed against two parallel wall regions of the molding tool. In other words, the two circuit carriers are put into position in the molding tool by the spring apparatus such that the outside faces are pushed against the opposite, parallel wall faces of the molding tool. This makes it possible to ensure that in the subsequent molding process, in which a molding compound is supplied to the molding tool, the two outsides which are in contact with the edge regions of the molding tool are open toward the outside in the manufactured electronic assembly. As a result, they are in the form of heat dissipation faces without the need for additional subsequent machining of the electronic assembly. This allows the electronic assembly according to the invention to be manufactured very easily and inexpensively. In this case, the spring apparatus may be of integral form with the two circuit carriers, or the spring apparatus is provided as a separate component. In addition, besides the integral spring apparatus, a further separate spring apparatus can also be provided. In this case, the spring force of the spring apparatus is chosen such that the outside faces of the circuit carriers are securely pushed against the wall regions of the molding tool during the molding process.

With particular preference, the method according to the invention involves the use of a spring apparatus comprising an electrically conductive material, which spring apparatus, prior to being placed into the molding tool, is connected to the circuit carriers in an electrically conductive fashion. By way of example, connection can be made by soldering or bonding or welding or using conductive adhesive.

BRIEF DESCRIPTION OF THE DRAWINGS

Preferred exemplary embodiments of the invention are described in detail below with reference to the accompanying drawing, in which:

FIG. 3 shows a schematic sectional view of an electronic assembly based on a second exemplary embodiment of the invention, and FIG. 4 shows a schematic sectional view of the electronic assembly from FIG. 3 during the manufacturing process.

DETAILED DESCRIPTION

An electronic assembly 1 based on a first preferred exemplary embodiment of the invention is described in detail below with reference to FIGS. 1 and 2.

Figure 1:
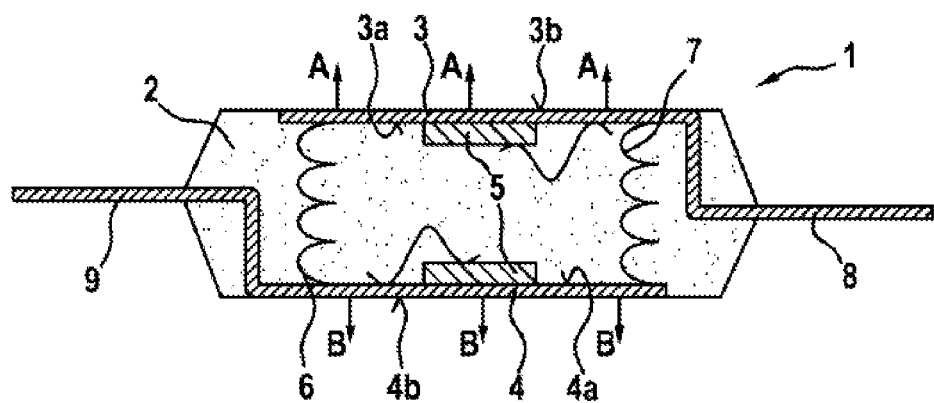
FIG. 1 shows a schematic sectional view of an electronic assembly based on a first exemplary embodiment of the invention.

As can be seen from FIG. 1, the electronic assembly 1 comprises a molded body 2, a first circuit carrier 3 and a second circuit carrier 4. The first circuit carrier 3 has a first electrical connection 8, and the second circuit carrier 4 has a second electrical connection 9. It should be noted that each of the circuit carriers may also have a plurality of electrical connections. The two circuit carriers 3, 4 are provided as separate components. Both circuit carriers 3, 4 are essentially areal components having an inside face 3a and an outside face 3b, or an inside face 4a and an outside face 4b. Electronic components 5 are arranged on the inside faces 3a, 4a in a known manner.

As can also be seen from FIG. 1, a spring apparatus having a first spring element 6 and a second spring element 7 is provided between the first circuit carrier 3 and the second circuit carrier 4. The two spring elements 6, 7 are supported directly on the inside faces 3a, 4b of the circuit carriers 3, 4. The two spring elements 6, 7 may be manufactured from an electrically conductive material and may also assume an electrical connection function. Alternatively or in addition, a spring element could be arranged between the electrical components 5 on the two circuit carriers 3, 4.

Figure 2:
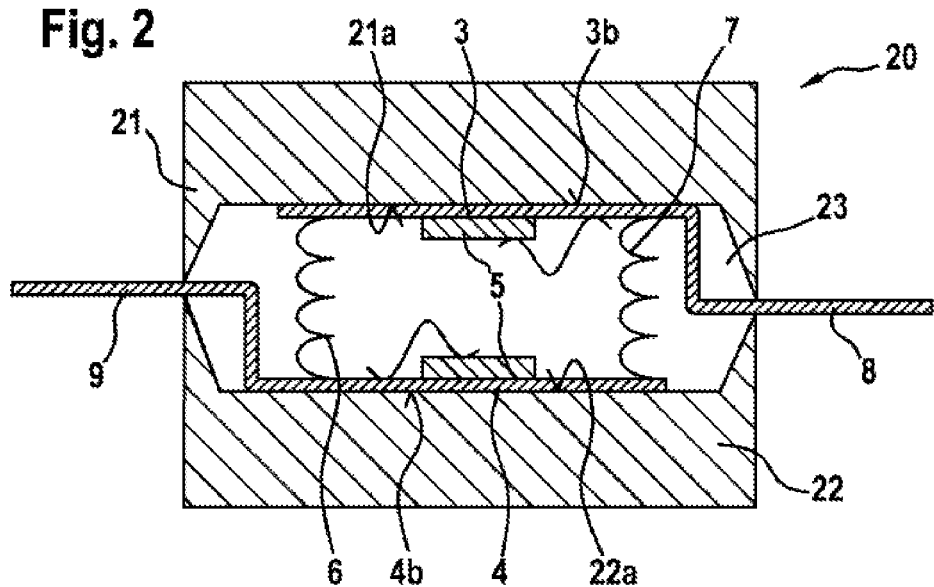
FIG. 2 shows a schematic sectional view of the electronic assembly from FIG. 1 during the manufacturing process.

In this case, FIG. 2 shows a section through a molding tool 20 with a first tool half 21 and a second tool half 22. As can be seen from FIG. 2, the first and second spring elements 6, 7 are arranged between the first and second circuit carriers 3, 4 in the molding tool 20. This pushes an outside face 3b of the first circuit carrier against a first wall face 21a of the first tool half. At the same time, the outside face 4b of the second circuit carrier 4 is pushed against a second wall face 22a of the second tool half 22. The two wall faces 21a, 22a are in this case arranged parallel to one another. As a result, the two outside faces 3b, 4b of the circuit carriers 3, 4 are also arranged parallel to one another. In this case, the circuit carriers 3, 4 are already fully populated, which means that in a subsequent step it is possible to introduce a molding compound into an inner cavity 23 in the molding tool 20. During this, the spring elements 6, 7 keep the two circuit carriers 3, 4 pushed against the wall faces 21a, 22a, as a result of which in the finished component, as shown in FIG. 1, the two outside faces 3b, 4b are arranged so as to be exposed toward the outside. This allows the two outside faces 3b, 4b to be used for dissipating heat from the electronic assembly 1. As can be seen from FIG. 1, this allows the heat to be dissipated in directions A (on the first outside face 3b) and B (on the second outside face 4b) which are 180° opposite one another.

As a result, the invention makes it possible to obtain a very easy and inexpensive method for manufacturing the electronic assembly 1 with two parallel heat dissipation faces that are exposed on the outside. In this case, the spring elements 6, 7 are completely surrounded by the molding compound. As a result, the spring elements 6, 7 in the finished electronic assembly no longer have a spring property, since the solidified molded body 2 prevents the spring elements 6, 7 from expanding. If appropriate, the spring elements 6, 7 can also assume electrically conductive functions.

The invention therefore uses the parallel nature of the molding tool 20 in order to produce electronic assemblies having circuit carrier faces that are open toward the outside. As a result, it is possible to manufacture electronic assemblies 1 having large cooling faces very easily and inexpensively.

In this exemplary embodiment, two spring elements are provided. However, it should be noted that it is also possible to use a single spring element or else a plurality of spring elements, for example four spring elements, which are arranged essentially on corner regions of the circuit carriers 3, 4. Instead of the helical springs shown, it is also possible to use other spring elements.

An electronic assembly 1 based on a second exemplary embodiment of the invention is described in detail below with reference to FIGS. 3 and 4, with portions which are the same or which have the same function being noted by the same reference symbols as in the first exemplary embodiment.

As can be seen from FIG. 3, in contrast to the first exemplary embodiment, the second exemplary embodiment does not involve the use of two separate circuit carriers, but rather the circuit carriers are represented by a common component 12, which also incorporates the spring apparatus. As can be seen from FIG. 3, the common component 12 is a leadframe which, assuming a common electrical connection 18 or a plurality of electrical connections 18, has a first circuit carrier 13, a second circuit carrier 14 and an integrated spring apparatus 16. The integrated spring apparatus 16 is in this case obtained by bending the leadframe a plurality of times, and it connects the first circuit carrier 13 to the second circuit carrier 14. Furthermore, there is additionally a separate spring element 6 provided as well. It should be noted that an embodiment is also possible without the separate spring element 6, in which case the spring action comes exclusively from the spring apparatus 16. Overall, an electronic assembly 1 is again provided in which the outside faces 13b and 14b of the circuit carriers 13, 14 are exposed toward the outside and can be used as heat dissipation faces, as indicated by the arrows A and B. The inside faces of the first and second circuit carriers 13, 14 are denoted by the reference symbols 13a and 14a. The common electrical connection 18 is routed out of the molding tool 20, so that it is then possible to introduce a molding compound into the cavity 23, as in the first exemplary embodiment, in order to produce the molded body 2. In this case, the molded body 2 encloses both the integrated spring apparatus 16 and the separate spring element 6.

Otherwise, this exemplary embodiment corresponds to the preceding exemplary embodiment, which means that reference can be made to the description provided therefor.

The invention claimed is:

1. An electronic assembly, comprising:
   a molded body (2),
   a first circuit carrier (3; 13) formed as a flat sheet having a first inside face (3a; 13a), on which electronic components (5) are arranged, and a first outside face (3b; 13b),
   a second circuit carrier (4; 14) formed as a flat sheet having a second inside face (4a; 14a), on which electronic components (5) are arranged, and a second outside face (4b; 14b), and
   at least one spring apparatus (16) which connects the inside faces (3a, 14a; 13a, 14a), or surfaces of electronic components (5) arranged thereon, of the first and second circuit carriers (3, 4; 13, 14), wherein the first and second outside faces (3a, 4a; 13a, 14a) are exposed toward the outside of the electronic assembly in order to dissipate heat directly to the outside, wherein the first and second outside faces (3a, 4a; 13a, 14a) are parallel to one another, and wherein the first and second circuit carriers (13, 14) and the spring apparatus (16) are an integral component (12) formed integrally as a single piece.

2. The electronic assembly as claimed in claim 1, characterized in that the integral component (12) is a leadframe.

3. The electronic assembly as claimed in claim 1, also comprising an additional, separate spring apparatus (6).

4. The electronic assembly as claimed in claim 1, characterized in that the first and second circuit carriers (13, 14) have a common electrical connection (18).

5. The electronic assembly as claimed in claim 3, characterized in that at least one of the spring apparatus (16) and the additional spring apparatus (6) is manufactured from an electrically conductive material and has an electrically conductive function.

\* \* \* \* \*